(12) United States Patent
Yamada et al.

(10) Patent No.: US 11,561,089 B2
(45) Date of Patent: Jan. 24, 2023

(54) THREE-DIMENSIONAL SHAPE DETECTION APPARATUS, THREE-DIMENSIONAL SHAPE DETECTION METHOD AND PLASMA PROCESSING APPARATUS

(71) Applicant: Hitachi High-Tech Corporation, Tokyo (JP)

(72) Inventors: Kenichiro Yamada, Tokyo (JP); Mitsuru Nagasawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/957,327

(22) PCT Filed: Jul. 4, 2019

(86) PCT No.: PCT/JP2019/026713
§ 371 (c)(1),
(2) Date: Jun. 23, 2020

(87) PCT Pub. No.: WO2020/121565
PCT Pub. Date: Jun. 18, 2020

(65) Prior Publication Data
US 2022/0120555 A1    Apr. 21, 2022

(51) Int. Cl.
*G01N 21/31* (2006.01)
*G01B 11/30* (2006.01)
(Continued)

(52) U.S. Cl.
CPC ........... *G01B 11/303* (2013.01); *G01N 21/31* (2013.01); *H01J 37/32082* (2013.01); *H01L 21/67069* (2013.01)

(58) Field of Classification Search
CPC ....... G01B 11/24; G01B 11/303; G01N 21/31
See application file for complete search history.

(56) References Cited

U.S. PATENT DOCUMENTS 8,980,049 B2    3/2015  Lee et al.
2004/0109173 A1  6/2004  Finarov et al.
(Continued)

FOREIGN PATENT DOCUMENTS

JP    2004022822 A    1/2004
JP    2006100619 A    4/2006
(Continued)

OTHER PUBLICATIONS

Search Report dated Sep. 24, 2019 in International Application No. PCT/JP2019/026713.

*Primary Examiner* — Hina F Ayub
(74) *Attorney, Agent, or Firm* — Miles & Stockbridge, P.C.

(57) ABSTRACT

To implement, when a plurality of patterns are included in a field of view during measurement of scattered light in spectral scatterometry, removal of an influence of a pattern outside a dimension (three-dimensional shape) management target from spectral reflection intensity in the field of view without modeling the pattern outside the dimension management target. A three-dimensional shape detection apparatus 100 includes a spectral reflection intensity measurement unit configured to measure spectral reflection intensity in a field of view of a light spot by irradiating a sample 103 as a target with the light spot, and detects a three-dimensional shape in the field of view of the light spot based on the measured spectral reflection intensity. The three-dimensional shape detection apparatus further has a spectral feature value calculation unit configured to calculate a spectral feature value in a first region in the field of view of the light spot in advance in an external control apparatus 102 thereof, and an area ratio estimation unit configured to estimate an area ratio between an area of the first region in the field of (Continued)

view of the light spot and an area of a second region outside the first region in the field of view of the light spot.

14 Claims, 9 Drawing Sheets

(51) Int. Cl.
    *H01J 37/32*     (2006.01)
    *H01L 21/67*     (2006.01)

(56) References Cited

U.S. PATENT DOCUMENTS

| | | |
|---|---|---|
| 2005/0274913 A1* | 12/2005 | Sawada .................. G01N 21/31 250/559.19 |
| 2009/0297404 A1 | 12/2009 | Shannon et al. |
| 2011/0253672 A1 | 10/2011 | Kamibayashi et al. |
| 2017/0169996 A1 | 6/2017 | Ui et al. |
| 2018/0286643 A1* | 10/2018 | Tuitje .................. G01B 11/0625 |
| 2019/0088452 A1 | 3/2019 | Yamada et al. |

FOREIGN PATENT DOCUMENTS

| | | |
|---|---|---|
| JP | 2006112884 A | 4/2006 |
| JP | 2007067037 A | 3/2007 |
| JP | 2011017076 A | 1/2011 |
| JP | 2012018097 A | 1/2012 |
| JP | 2013148447 A | 8/2013 |
| JP | 2019057547 A | 4/2019 |
| KR | 20110116955 A | 10/2011 |
| KR | 20140040640 A | 4/2014 |

* cited by examiner

[FIG. 1]
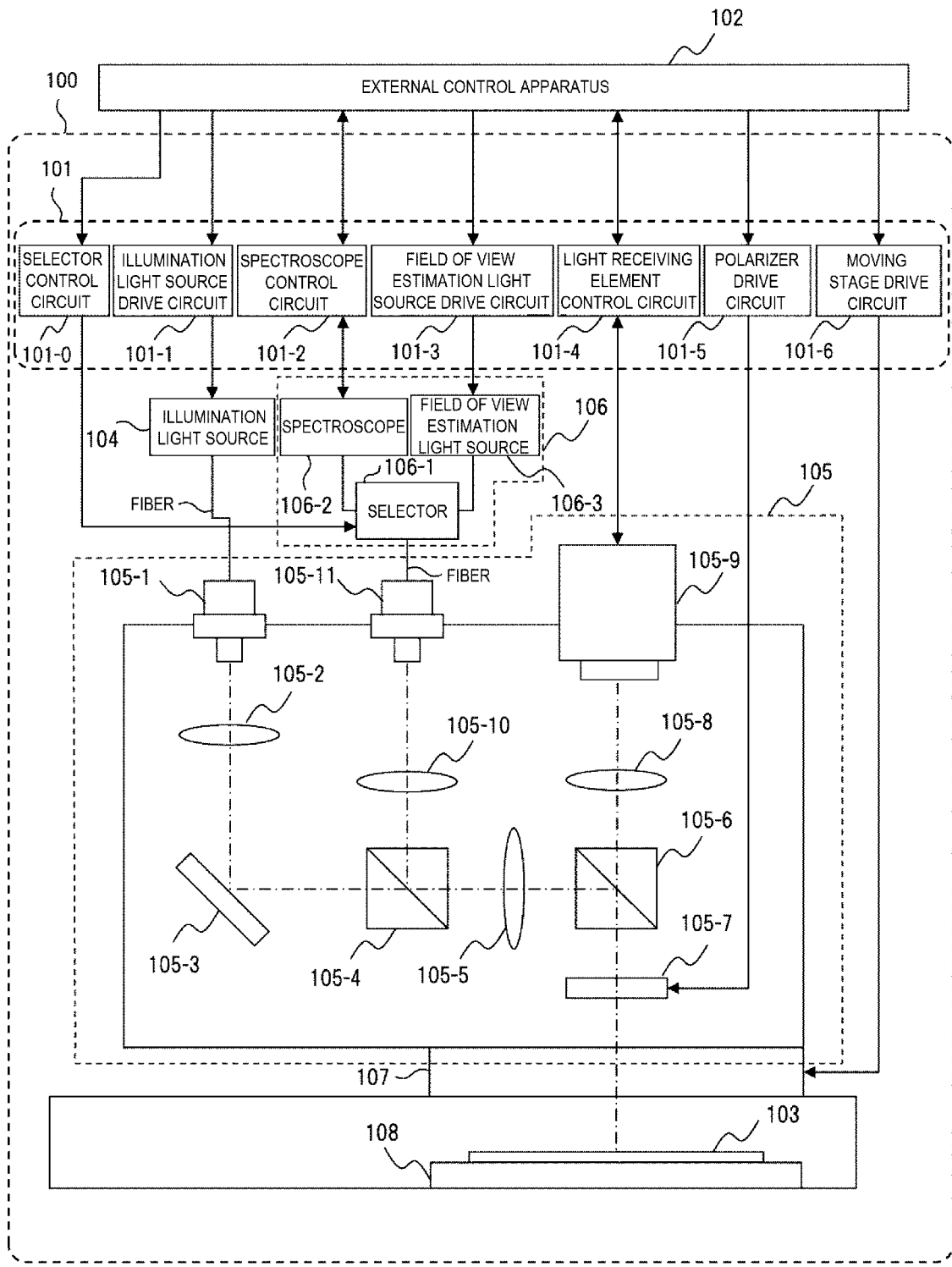

[FIG. 2]
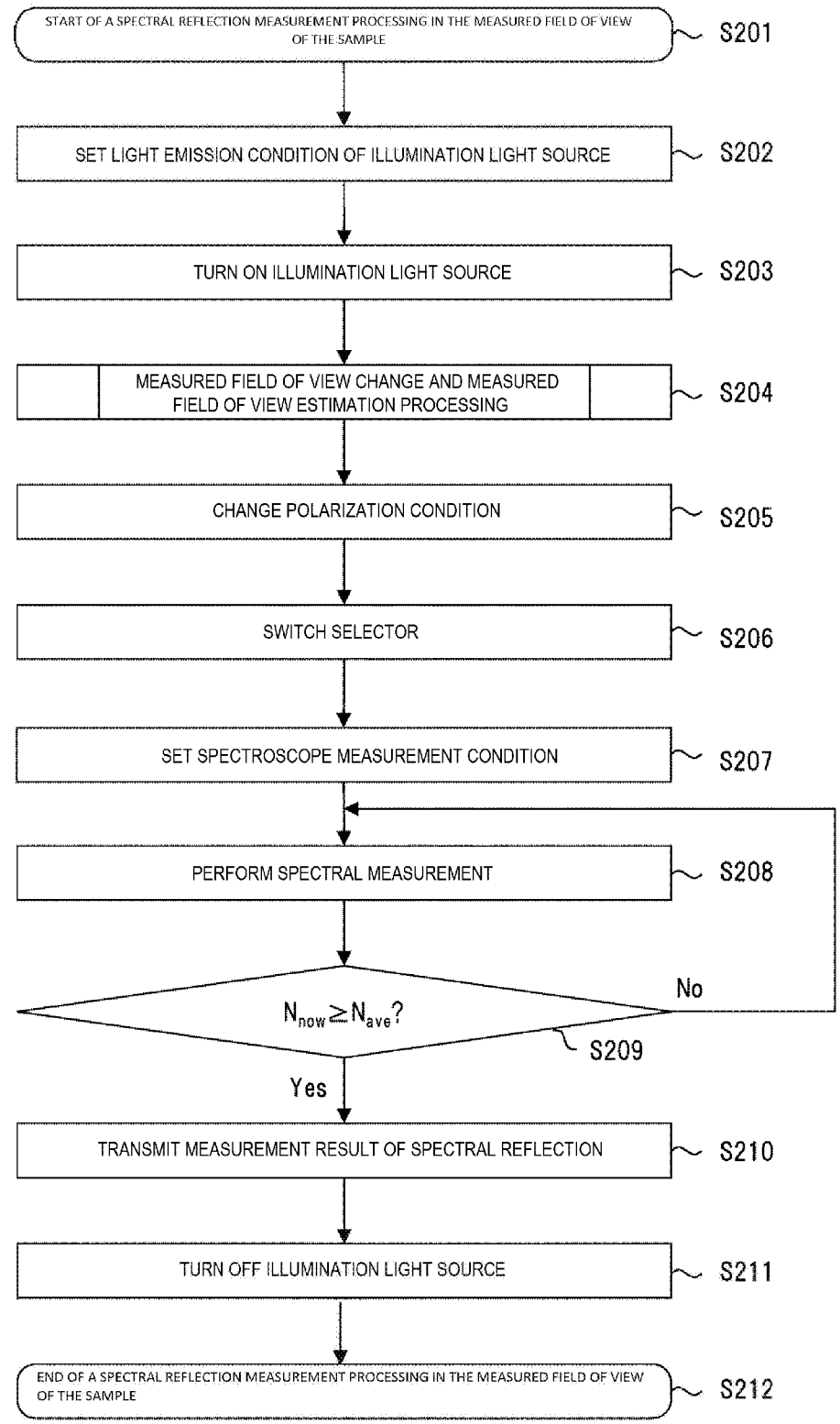

[FIG. 4]
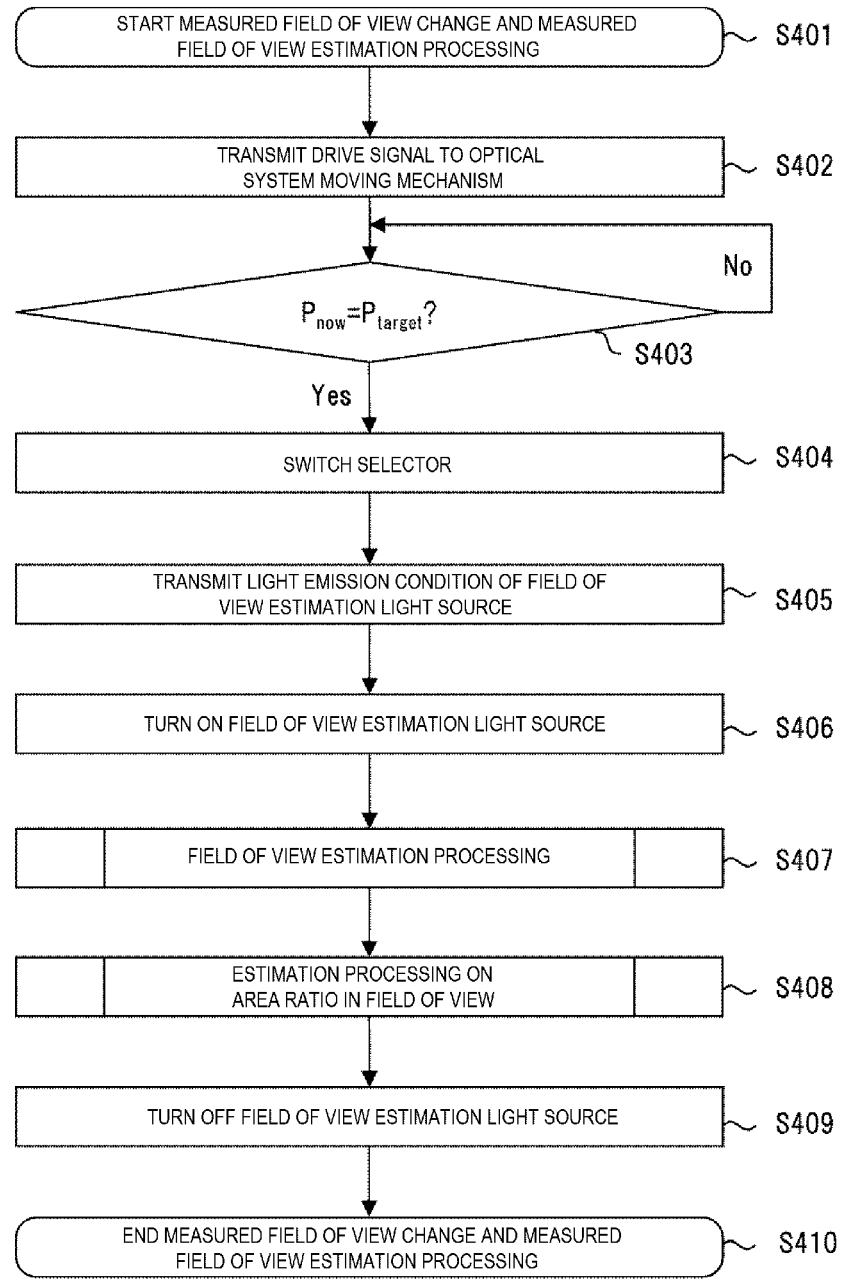

View of Scatterometry

[FIG. 6]
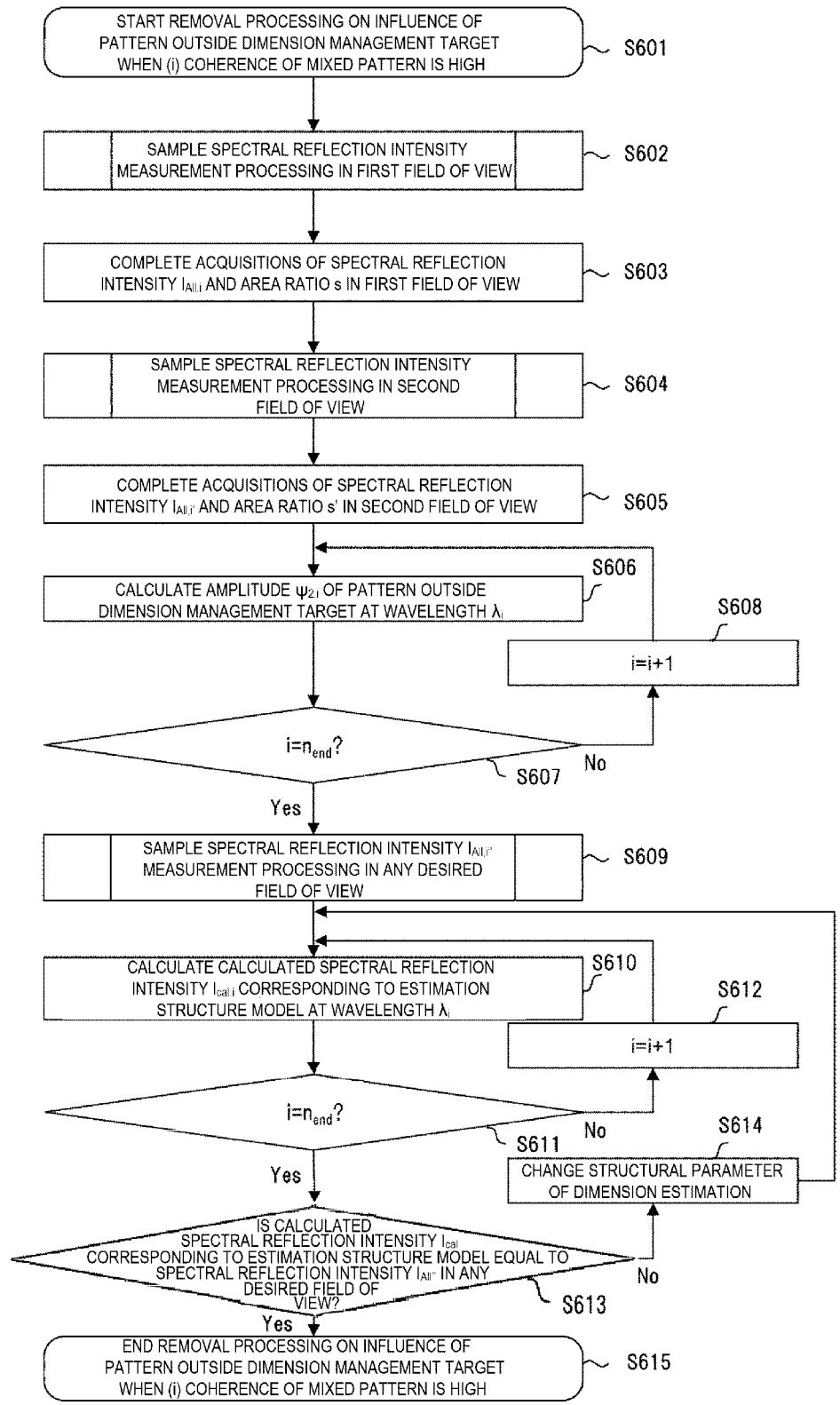

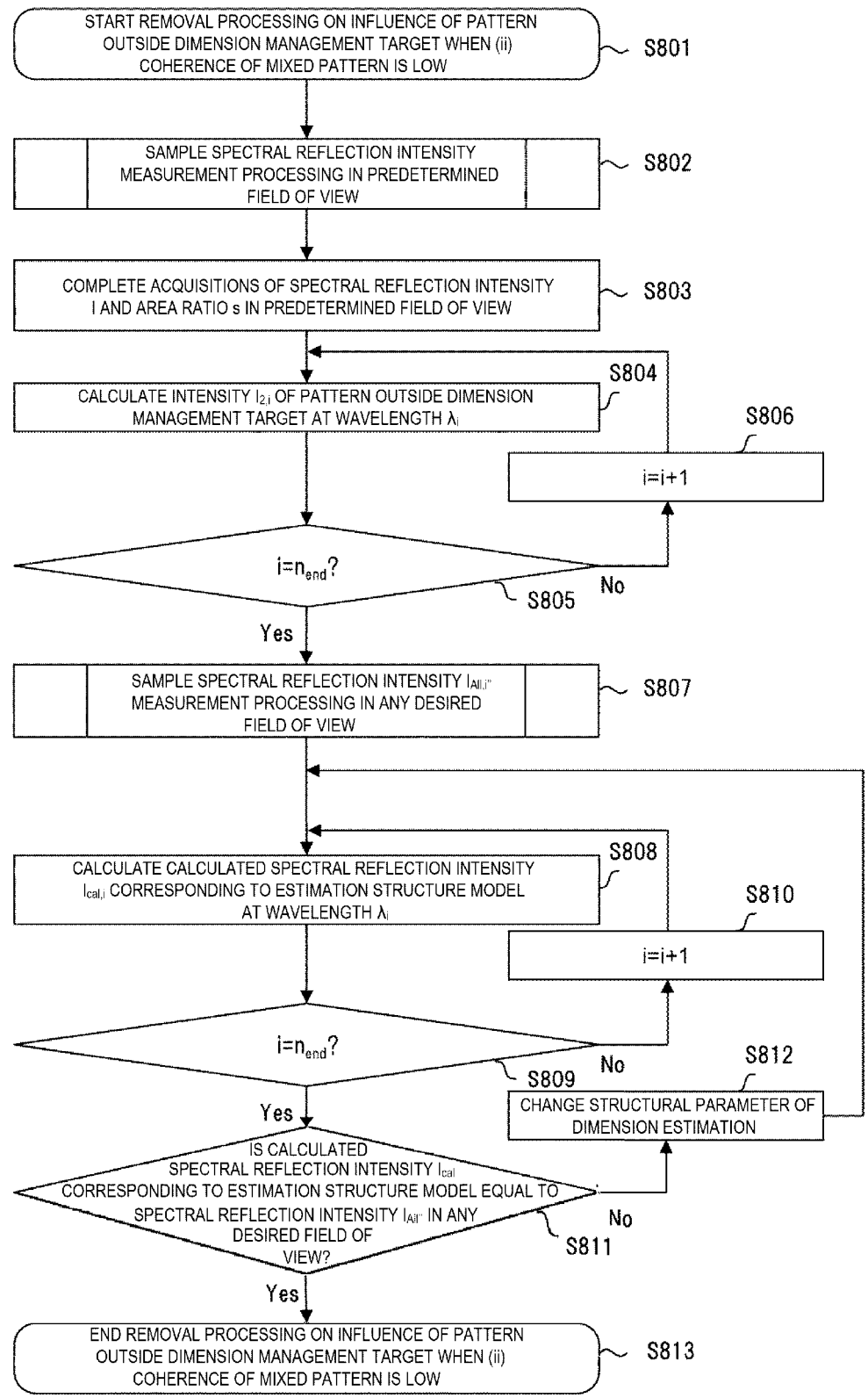
[FIG. 8]

[FIG. 9]
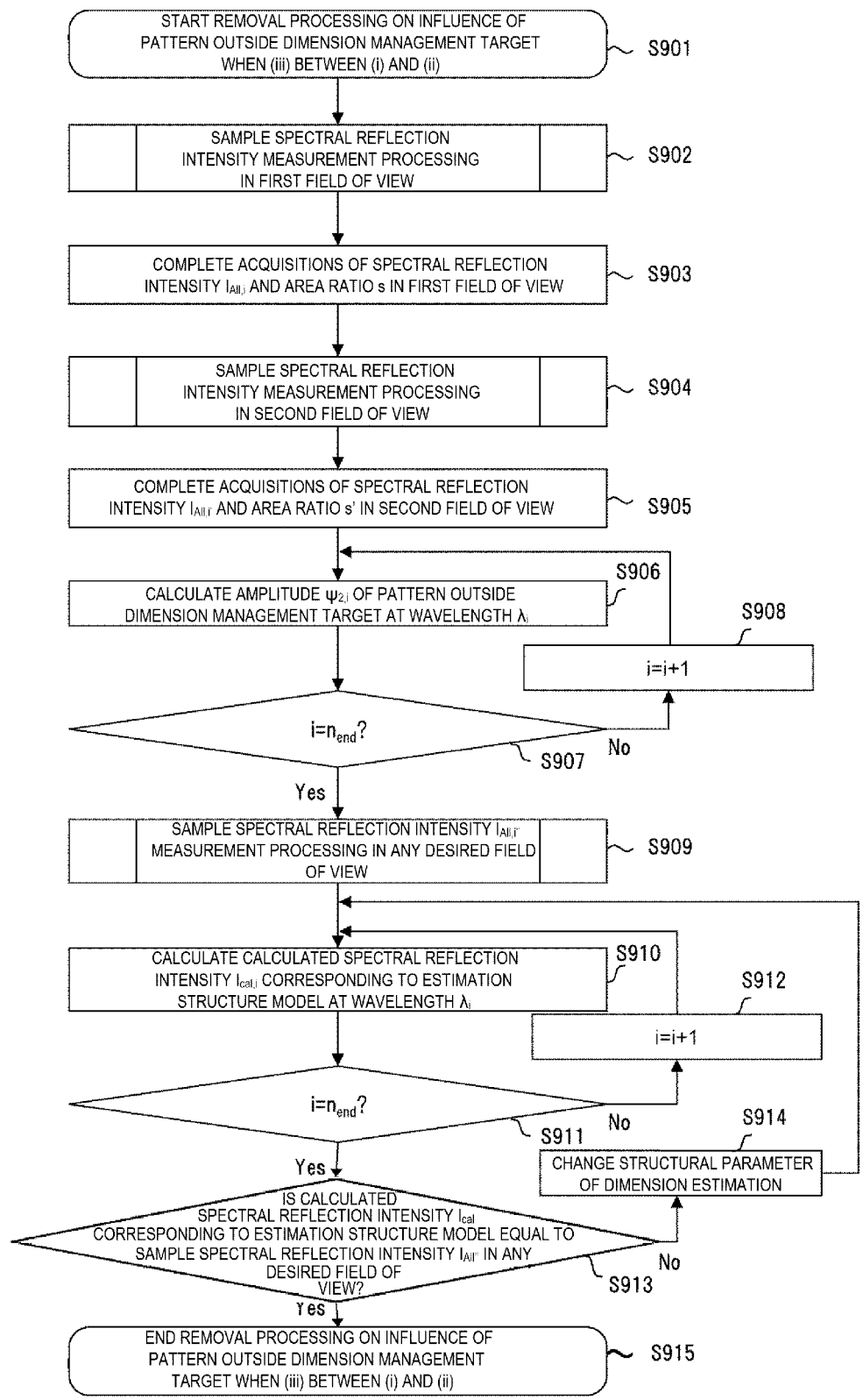

US 11,561,089 B2

THREE-DIMENSIONAL SHAPE DETECTION APPARATUS, THREE-DIMENSIONAL SHAPE DETECTION METHOD AND PLASMA PROCESSING APPARATUS

TECHNICAL FIELD

The present invention relates to a technique for measuring a patterned surface shape of a wafer in a semiconductor manufacturing process or after the process or the like.

BACKGROUND ART

As miniaturization of semiconductor devices advances, importance of examining a process status of a semiconductor wafer surface has increased. In particular, in a semiconductor manufacturing process, measurement of a critical dimension (CD) of a circuit pattern processed in a nanoscale is required, and the measurement is performed using a measuring scanning electron microscope (SEM), an atomic force microscope (AFM), or the like. In particular, when an in-situ measurement is assumed, a three-dimensional shape measurement by an optical critical dimension (OCD) measurement method (also referred to as a light wave scattering measurement method, that is, scatterometry) is used with emphasis on non-contact, non-destructive, and real-time properties. When reflection measurement of measuring a surface structure pattern having a periodic structure is performed over a wide band, spectral is prefixed, and the measurement is referred to as spectral scatterometry.

In general, in the measurement by the spectral scatterometry, a test pattern called a test element group (TEG) is formed in a scribe region and the like of a semiconductor wafer, and the measurement is performed on the TEG to perform a dimension management of a process. On the other hand, for example, PTL 1 discloses that there are the following problems regarding dimension (three-dimensional shape) management of an actual layout pattern by the measurement of the TEG.

(1) In the scribe region, it is not possible to secure an area necessary for arranging various marks reflecting various layout patterns.

(2) Since positions in the semiconductor wafer are different between a mark of the scribe region and the actual layout pattern, dimensional variation amounts in the semiconductor wafer accompanying the process are different, and it is difficult to perform the dimension management with high accuracy.

(3) In the mark of the scribe region and the actual layout pattern, pattern densities including a surrounding layout pattern are different. That is, degrees of influence by a so-called proximity effect (a phenomenon in which a pattern dimension after exposure or development depending on the pattern density changes) are different.

CITATION LIST

Patent Literature

PTL 1: JP-A-2006-100619
PTL 2: JP-A-2019-57547

SUMMARY OF INVENTION

Technical Problem

To solve the above problems (1) to (3), PTL 1 discloses a solution related to a layout pattern used in a semiconductor apparatus manufacturing method and a semiconductor manufacturing apparatus. However, it is difficult to apply the solution disclosed in PTL 1 in an in-situ wafer surface inspection process in a later stage of the semiconductor manufacturing process or after the process, instead of a layout design stage.

Therefore, as a solution to solve the above problems in a three-dimensional shape inspection process in the process and after the process, it is considered that a measurement by the spectral scatterometry is performed using an actual layout pattern instead of the TEG. Thus, related to the problem (1), it is not necessary to arrange various layout patterns for inspection in the first place. Related to the problem (2), since the actual layout pattern is an inspection position, it is not necessary to consider a change in the variation amount. Related to the problem (3), since the actual layout pattern is the inspection position, it is not necessary to consider the influence of the proximity effect. That is, the problems of (1) to (3) can be solved by the measurement by the spectral scatterometry on the actual layout pattern.

In the spectral scatterometry, an analysis based on a vector diffraction theory for periodic grooves using rigorous coupled wave analysis (RCWA) is generally applied. At this time, a region requiring modeling of a structure (including determination of optical constants such as refractive index and extinction coefficient as well as the structure) required by the RCWA may be, if a field of view is a single pattern, only a minimum periodic structure that forms the single pattern.

However, when a plurality of patterns are included in the field of view during measurement of scattered light, it is necessary to model all minimum periodic structures in the plurality of patterns. Since the region requiring modeling is very large compared with the single pattern, it is practically difficult to model a plurality of complicated and large patterns included in the field of view. Therefore, in order to enable the spectral scatterometry in the actual layout pattern, it is necessary to remove an influence of a pattern outside a dimension management target from a spectral reflection of a plurality of patterns included in the field of view during measurement of scattered light without modeling.

An object of the invention is to provide a three-dimensional shape detection apparatus, a three-dimensional shape detection method, and a plasma processing apparatus in which when a plurality of patterns are included in a field of view during measurement of scattered light in spectral scatterometry, an influence of a pattern outside a dimension management target of a three-dimensional shape can be removed from a spectral reflection intensity in the field of view, so that the dimension management can be enabled in any field of view.

Solution to Problem

In order to achieve the above object, according to the invention, there is provided a three-dimensional shape detection apparatus that detects a three-dimensional shape in a field of view of a light spot with which a target is irradiated, the three-dimensional shape detection apparatus including: a spectral reflection intensity measurement unit configured to measure a spectral reflection intensity; a spectral feature value calculation unit configured to obtain a spectral feature value of a first region, which is a region in the field of view of the light spot, based on the spectral reflection intensity measured by the spectral reflection intensity measurement unit; an area ratio estimation unit configured to capture an image of the target illuminated by an emitted light and estimate an area ratio between an area of the first region and an area of a second region based on the captured image; and a control device configured to obtain the three-dimensional shape based on the estimated area ratio, in which the second region is a region outside the first region in the field of view of the light spot.

In order to achieve the above object, according to the invention, there is provided an area ratio estimation method for estimating an area ratio which is used in detecting a three-dimensional shape in a field of view of a light spot with which a target is irradiated, the area ratio estimation method including: capturing an image of the target illuminated by an emitted light and estimating the area ratio based on the captured image, in which the area ratio is an area ratio between an area of a first region and an area of a second region, the first region is a region in the field of view of the light spot, and the second region is a region outside the first region in the field of view of the light spot.

In order to achieve the above object, according to the invention, there is provided a three-dimensional shape detection method for detecting a three-dimensional shape in a field of view of a light spot with which a target is irradiated, the three-dimensional shape detection method including: a step of measuring a spectral reflection intensity; a step of obtaining a spectral feature value of a first region in the field of view of the light spot based on the measured spectral reflection intensity; a step of capturing an image of the target illuminated by an emitted light and estimating an area ratio between an area of the first region and an area of a second region based on the captured image; and a step of obtaining the three-dimensional shape based on the estimated area ratio, in which the second region is a region outside the first region in the field of view of the light spot.

In order to achieve the above object, according to the invention, there is provided a plasma processing apparatus including: a processing chamber in which a sample is subjected to plasma processing; a radio frequency power supply configured to supply radio frequency power for generating plasma; a sample stage on which the sample is placed; and a three-dimensional shape detection apparatus configured to detect a three-dimensional shape in a field of view of a light spot with which the sample is irradiated, in which the three-dimensional shape detection apparatus includes: a spectral reflection intensity measurement unit configured to measure a spectral reflection intensity; a spectral feature value calculation unit configured to obtain a spectral feature value of a first region, which is a region in the field of view of the light spot, based on the spectral reflection intensity measured by the spectral reflection intensity measurement unit; an area ratio estimation unit configured to capture an image of the sample illuminated by an emitted light and estimate an area ratio between an area of the first region and an area of a second region based on the captured image; and a control device configured to obtain the three-dimensional shape based on the estimated area ratio, in which the second region is a region outside the first region in the field of view of the light spot.

Advantageous Effect

According to the invention, an influence of a pattern outside a dimension management target of a three-dimensional shape can be removed from spectral reflections of a plurality of patterns in a field of view during measurement of scattered light in spectral scatterometry, and dimension management of an actual layout pattern can be implemented.

BRIEF DESCRIPTION OF DRAWINGS

FIG. 1 is a diagram showing a configuration example of a three-dimensional shape detection apparatus that performs dimension management of an actual layout pattern according to a first embodiment.

FIG. 2 is a flowchart of a sample spectral reflection intensity measurement processing according to the first embodiment.

FIG. 4 is a flowchart of a measured field of view change and a measured field of view estimation processing according to the first embodiment.

FIG. 6 is a flowchart of a removal processing on influence of a pattern outside a dimension management target according to the first embodiment.

FIG. 8 is a flowchart of a removal processing on influence of a pattern outside a dimension management target according to a second embodiment.

FIG. 9 is a flowchart of a removal processing on influence of a pattern outside a dimension management target according to a third embodiment.

DESCRIPTION OF EMBODIMENTS

Hereinafter, embodiments of the invention will be described with reference to the figures. Before that, with reference to FIG. 3A and FIG. 3B, a description will be given on a problem during measurement in a TEG that is assumed to be measured by spectral scatterometry.

Figure 3A:
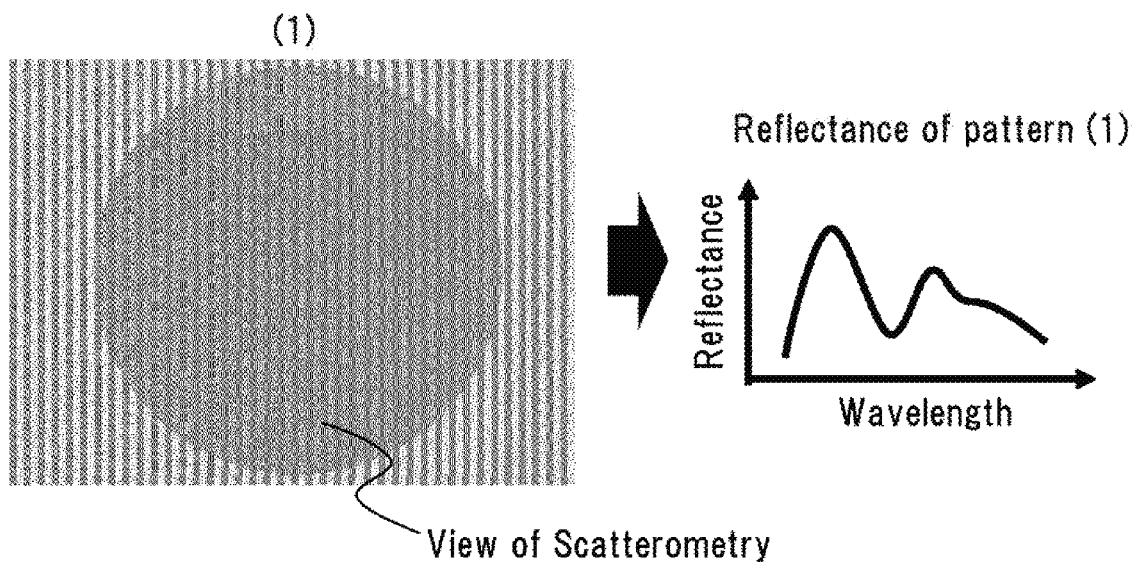
FIG. 3A and FIG. 3B are schematic views of a field of view during measurement of scattered light in a TEG and a mixed pattern according to the first embodiment.

As shown in FIG. 3A, a sufficiently wide field of view (a light spot: view of scatterometry) during measurement of scattered light is secured as a test pattern. Here, in (a), a pattern (1) indicates a pattern as a dimension management target by a three-dimensional shape inspection. In (a), since a measured field of view is occupied by the pattern (1), a spectral reflection intensity or spectral reflectance obtained as a measurement result of a scattered light is only an contribution of the pattern (1).

Figure 3B:
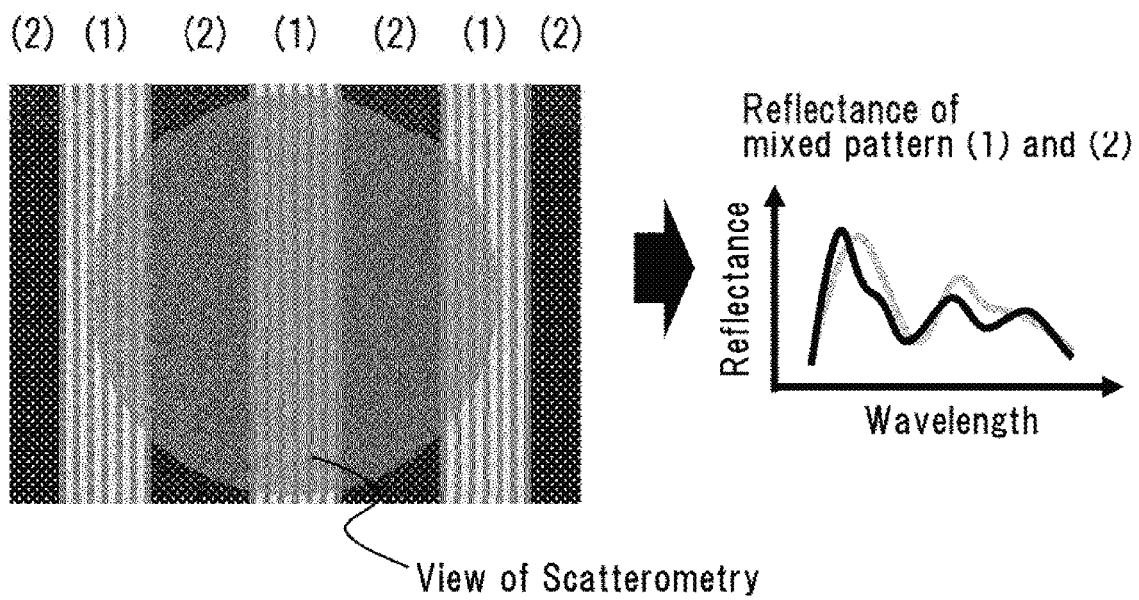

On the other hand, in an actual layout pattern, since a layout is not based on the measurement of scattered light, other patterns, wiring regions and the like other than the pattern as the dimension management target are densely mixed. In addition, since light in a band of visible light (about 400 nm to about 800 nm) is generally used in the spectral scatterometry, reduction in a size of the light spot by using an imaging optical system is limited, and it is difficult to fit a field of view (a light spot) during measurement of scattered light in the region of the pattern as the dimension management target. That is, as shown in FIG. 3B, the measurement result of the scattered light is observed as a reflectance of a mixed pattern including not only the pattern (1) as the dimension management target by the three-dimensional shape inspection, but also a pattern (2) outside the dimension management target. In the present description, the pattern (1) is referred to as a first region which is a region in a field of view of a light spot which can be calculated in advance, and the pattern (2) is referred to as a second region which is a region outside the first region in the field of view of the light spot.

As described above, it is inevitable that, when the spectral scatterometry is to be performed in the actual layout pattern, a pattern as the dimension management target in the field of view during measurement of scattered light, that is, the pattern (1) in FIG. 3B is mixed with a pattern, a wiring region, or the like other than the pattern (1) in FIG. 3B, that is, the pattern (2) in FIG. 3B.

As shown in FIG. 3B, when the spectrum measurement is performed on the mixed pattern including the pattern (1) and the pattern (2), the mixed pattern is classified into a plurality of forms due to mutual coherence of the mixed pattern in the field of view (the light spot: view of scatterometry) during measurement of scattered light in the present embodiment. The mixed pattern is classified into (i) when the coherence of the mixed pattern is high (coherent), (ii) when the coherence of the mixed pattern is low (incoherent), and (iii) between (i) and (ii) in three embodiments. According to the present embodiment, a coherence factor fc is set as Formula 1 as a factor that defines the coherence of the mixed pattern.

[Math 1]

$$f_c \begin{cases} f_c \cong 1 & (i) \text{ Coherent} \\ f_c \cong 0 & (ii) \text{ Incoherent} \\ f_c \cong 0 \sim 1 & (iii) \text{ Between } (i) \text{ and } (ii) \end{cases} \quad \text{(Formula 1)}$$

Here, the coherence factor fc is a variable defined by a specification of an optical system for performing the spectrum measurement, and a pitch of the minimum period of the mixed pattern in the field of view during measurement of scattered light.

According to the present embodiment, a case where the coherence factor fc is substantially equal to 1 is classified as (i) in which the coherence of the mixed pattern is high (coherent), a case where the coherence factor fc is substantially equal to 0 is classified as (ii) in which the coherence of the mixed pattern is low (incoherent), and a case where the coherence factor fc is between 0 and 1 is classified as (iii) in which the coherence of the mixed pattern is between (i) and (ii). The coherence classification does not need to match rules shown in the above Formula, and the coherence factor fc does not necessarily have to be set. In the following description of the embodiments, first, a method of removing an influence of a pattern outside the dimension management target without modeling when (i) the coherence of the mixed pattern is high (coherent) will be described below.

First Embodiment

The first embodiment is an embodiment of a three-dimensional shape detection apparatus and a three-dimensional shape detection method for removing the influence of the pattern outside the dimension management target without modeling when (i) the coherence of the mixed pattern is high (coherent). That is, the first embodiment relates to a three-dimensional shape detection apparatus and a detection method, in which the three-dimensional shape detection apparatus that detects a three-dimensional shape in a field of view of a light spot with which a target is irradiated includes: a spectral reflection intensity measurement unit configured to measure a spectral reflection intensity; a spectral feature value calculation unit configured to obtain a spectral feature value of a first region, which is a region in the field of view of the light spot, based on the spectral reflection intensity measured by the spectral reflection intensity measurement unit; an area ratio estimation unit configured to capture an image of the target illuminated by an emitted light and estimate an area ratio between an area of the first region and an area of a second region based on the captured image; and a control device configured to obtain a three-dimensional shape based on the estimated area ratio, in which the second region is a region outside the first region in the field of view of the light spot.

FIG. 1 is a schematic view and a functional block diagram of the three-dimensional shape detection apparatus that uses the spectral scatterometry, and performs the dimension management of the actual layout pattern by removing the influence of the pattern outside the dimension management target from the spectral reflection of the mixed pattern, in other words, detects a three-dimensional shape in the measured field of view of a sample.

As shown in FIG. 1, a three-dimensional shape detection apparatus 100 is connected to an external control device 102 via a controller group 101. The external control device 102 has an internal function such as a central processing unit (CPU) executing a program for calculating a spectral feature value by a model calculation of the RCWA (not shown) as a pre-spectral feature value calculation function. When detecting a three-dimensional shape in a measured field of view of a sample 103, the three-dimensional shape detection apparatus 100 starts detection based on a signal received from the external control device 102. Therefore, according to the three-dimensional shape detection apparatus in the description, it can be considered that the three-dimensional shape detection apparatus 100 includes the external control device 102.

The three-dimensional shape detection apparatus 100 includes, in addition to the controller group 101, an illumination light source 104, an optical system 105, a spectroscope group 106, an optical system moving mechanism 107, and a sample transport mechanism 108.

The illumination light source 104 is a wide band light source capable of measuring characteristics of the sample 103 by the spectral scatterometry, and is implemented by, for example, a light source combining a plurality of light emitting diodes LEDs having different center wavelengths. The illumination light source 104 is not necessarily limited to an LED light source, and may be another light source such as a halogen lamp or a deuterium lamp. When the illumination light source 104 is turned on, an illumination light source drive signal for turning on the illumination light source at a desired intensity from an illumination light source drive circuit 101-1 is input to the illumination light source 104.

The spectroscope group 106 detects reflected scattered light by the sample 103 in the measured field of view in the three-dimensional shape detection apparatus 100. The spectroscope group 106 in the present embodiment includes a selector 106-1, a spectroscope 106-2, and a field of view estimation light source 106-3. The spectroscope 106-2 measures the reflected scattered light in a wide band when the sample 103 is irradiated with the illumination light source 104. The field of view estimation light source 106-3, together with the external control device 102 and an imaging element 105-9 to be described later, constitutes an area ratio estimation unit of the three-dimensional shape detection apparatus of the present embodiment, and may be referred to herein as a field of view detection light source.

The sample transport mechanism 108 transports the sample 103 to be detected from a sample storage unit (not shown) to a position where the sample 103 can be irradiated with a detection field of view of the optical system 105. The sample transport mechanism 108 includes a sample fixing mechanism (not shown) to which the sample 103 can be fixed.

The three-dimensional shape detection apparatus 100 may not be a single unit, and may be combined with an apparatus having other functions. For example, the three-dimensional shape detection apparatus 100 may be combined with a plasma processing apparatus that performs surface treatment with plasma, which is a structure changing unit that changes a structure of the target, or a scanning electron microscope (SEM), so as to detect a three-dimensional shape in the measured field of view of the sample 103. A basic configuration of the plasma processing apparatus includes, for example, as disclosed in PTL 2 and the like previously filed by the present applicant, a processing chamber in which a target is subjected to plasma processing, a radio frequency power supply that supplies radio frequency power of microwaves, a magnetic field forming unit that forms a magnetic field for generating plasma by an interaction of the microwaves, and a control unit that controls the radio frequency power supply and the magnetic field forming unit, and a main part of the three-dimensional shape detection apparatus 100 of the present embodiment is installed in the processing chamber.

The measured field of view of the three-dimensional shape detection apparatus 100 is determined by a relative positional relationship between the optical system 105 and the sample 103. The optical system 105 is installed on a casing of the optical system moving mechanism 107, and the measured field of view of the three-dimensional shape detection apparatus 100 in the sample 103 can be changed by moving the optical system moving mechanism 107. The optical system moving mechanism 107 is implemented by, for example, combining mechanisms with two moving orthogonal axes, and can be moved by any desired distance within the two axes parallel to the sample 103. However, the movable axes do not necessarily have to be two-dimensional, and may be one-dimensional as long as the measured field of view of the three-dimensional shape detection apparatus 100 can be moved to a desired position.

When the optical system moving mechanism 107 is moved, a drive signal necessary for driving by a desired moving distance from a moving stage drive circuit 101-6 included in the controller group 101 is input to the optical system moving mechanism 107. The optical system moving mechanism 107 is implemented by, for example, a stepping motor stage, and a number of pulse signals corresponding to the moving distance in driving by the desired moving distance are input from the moving stage drive circuit 101-6 to the optical system moving mechanism 107. The optical system moving mechanism 107 may not necessarily be a stepping motor stage, and may be, for example, a DC motor stage, and may be another implementing units such as a closed loop control system in combination with the moving stage driving circuit 101-6 based on a signal from a current position detection system (not shown). Although a relative position of the optical system 105 and the sample 103 is changed by moving the optical system 105 by the optical system moving mechanism 107 in FIG. 1, the relative position may be changed by moving the sample 103 by the sample transport mechanism 108.

A spectral reflection measurement processing in the measured field of view of the sample 103 in the present embodiment will be described with reference to FIG. 2. FIG. 2 is a flowchart of the spectral reflection measurement processing in the measured field of view of the sample 103. An operation subject of this flowchart is mainly the external control device 102. When the spectral reflection measurement processing of the sample 103 is started (step 201, hereinafter S201), light emission conditions such as intensity of the illumination light source 104 are set from the external control device 102 via the illumination light source drive circuit 101-1 (S202). After the light emission conditions of the illumination light source 104 are set, the processing proceeds to S203.

In S203, a signal for turning on light emission of the illumination light source 104 is input from the external control device 102 via the illumination light source drive circuit 101-1. As a result, the illumination light source drive circuit 101-1 transmits a drive signal to turn on the illumination light source 104 under the conditions set in S202. The illumination light source 104 starts emitting light according to the drive signal input from the illumination light source drive circuit 101-1. The light from the illumination light source 104 is input to a connector A 105-1 constituting the optical system 105 via a fiber. The light input to the connector A 105-1 passes through a lens group A 105-2 and becomes an optically collimated light. The collimated light passed through the lens group A 105-2 is a light beam reflected by a mirror 105-3, and the reflected light beam transmits through a non-polarizing beam splitter A 105-4 which is optically designed such that the light beam is reflected or transmitted at a predetermined splitting ratio. A component ratio of P-polarized light and S-polarized light of the light reflected or transmitted by the non-polarizing beam splitter A 105-4 is equal. The light transmitted through the non-polarizing beam splitter A 105-4 passes through a lens group B 105-5. The light passed through the lens group B 105-5 becomes convergent light such that a spot diameter on the sample 103 becomes a predetermined spot size, and then is reflected by a non-polarizing beam splitter B 105-6 which is optically designed such that the light is reflected or transmitted at a predetermined splitting ratio. A component ratio of P-polarized light and S-polarized light of the light reflected or transmitted by the non-polarizing beam splitter B 105-6 is equal. The light reflected by the non-polarizing beam splitter B 105-6 transmits through a polarizer 105-7. The light transmitted through the polarizer 105-7 is incident on the sample 103 by changing a polarization state to a specific linearly polarized light, and is reflected on a surface of the sample 103. The light reflected on the surface of the sample 103 travels in substantially the same path in a direction opposite to that at the time of incidence. Of the light reflected on the sample 103, light transmitted through the non-polarizing beam splitter B 105-6 transmits through a lens group C 105-8 and is imaged on the imaging element 105-9. On the other hand, light reflected together in the non-polarizing beam splitter B 105-6 and the non-polarizing beam splitter A 105-4 is condensed to a connector B 105-11 by a lens group D 105-10. That is, when the light source is turned on in S203, surface reflected light in the measured field of view of the sample 103 reaches the selector 106-1 via the connector B 105-11. Both of the beam splitters 105-4 and 105-6 in the optical system 105 according to the present embodiment are not necessarily a non-polarizing beam splitter, and other optical components may be used as long as they are optical components capable of implementing a similar effect from a viewpoint of separation of incident light beams.

After the light emission of the illumination light source 104 is turned on in S203, the processing proceeds to S204. In S204, a measured field of view change to a predetermined field of view and a measured field of view estimation processing, which will be described later, are performed, and thereafter, the processing proceeds to S205 in which a polarization condition is changed. A size of the measured field of view estimated in S204 is smaller than a region illuminated in S203. In S205, by driving the polarizer 105-7 from the external control device 102 via a polarizer drive circuit 101-5, the polarization condition is set and changed so as to obtain a specific linearly polarized light, and then the processing proceeds to S206.

In S206, optical path switching of an optical fiber is executed in the selector 106-1 from the external control device 102 via a selector control circuit 101-0. In the switching of S206, the optical path is set on a spectroscope side. That is, in S206, the surface reflected light in the measured field of view of the sample 103 reaches the spectroscope 106-2. After the selector switching in S206, the processing proceeds to S207 in which spectroscope measurement conditions are set. In S207, the measurement conditions during measurement of the spectral reflection such as an exposure time or an average number of times are set for the spectroscope 106-2 from the external control device 102 via a spectroscope control circuit 101-2. After the measurement conditions are set, the processing proceeds S208 in which the spectral measurement is performed.

In S208, the spectral reflection measurement by the spectroscope control circuit 101-2 is performed based on the exposure time set in S207 from the external control device 102 via the spectroscope control circuit 101-2, and the processing proceeds to S209. In S209, it is determined whether a current spectral reflection measurement number of times Nnow reached an average number of times Nave set in S207. When the current spectral reflection measurement number of times Nnow is equal to or less than the average number of times Nave set in S207 (No in S209), the processing proceeds to S208 again. On the other hand, when the spectral reflection measurement number of times Nnow is equal to or more than the average number of times Nave set in S207 (Yes in S209), the processing proceeds to S210.

In S210, a measurement result of the spectral reflection measured by the spectroscope 106-2 is transmitted to the external control device 102 via the spectroscope control circuit 101-2. When the transmission of the measurement result of the spectral reflection is ended, the processing proceeds to S211. In S211, a signal for turning off of the illumination light source 104 is input from the external control device 102 via the illumination light source drive circuit 101-1. As a result, the illumination light source drive circuit 101-1 transmits a drive signal to turn off the illumination light source 104. When the illumination light source 104 is turned off in S211, the spectral reflection measurement processing in the measured field of view of the sample 103 is ended (S212).

Next, the measured field of view change and the measured field of view estimation processing (S204) in the present embodiment will be described with reference to FIG. 4. FIG. 4 is a flowchart of the measured field of view change and the measured field of view estimation processing in the sample 103. An operation subject of this flowchart is mainly the external control device 102. When the measured field of view change and the measured field of view estimation processing in the sample 103 are started (S401), a drive signal necessary to drive by a desired moving distance is transmitted from the external control device 102 via the moving stage drive circuit 101-6 to the optical system moving mechanism 107 (S402). After the drive signal is transmitted, the processing proceeds to S403.

In S403, it is determined whether a current position Pnow of the optical system moving mechanism 107 substantially matches a target position Ptarget. When it is determined that the optical system moving mechanism 107 is still moving (No in S403), the processing proceeds to S403 again. On the other hand, when it is determined that the moving of the optical system moving mechanism 107 is completed and the current position Pnow substantially matches the target position Ptarget (Yes in S403), the processing proceeds to S404.

In S404, optical path switching of an optical fiber is executed in the selector 106-1 from the external control device 102 via the selector control circuit 101-0. In the switching of S404, the optical path is set on a field of view estimation light source 106-3 side.

After the selector switching, the processing proceeds to S405. In S405, the light emission conditions such as the intensity of the field of view estimation light source 106-3 are set from the external control device 102 via a field of view estimation light source drive circuit 101-3. After the light emission conditions of the field of view estimation light source 106-3 are set, the processing proceeds to S406. In S406, a signal for turning on light emission of the field of view estimation light source 106-3 is input from the external control device 102 to the field of view estimation light source drive circuit 101-3. As a result, the field of view estimation source drive circuit 101-3 transmits a drive signal to turn on the field of view estimation light source 106-3 under the conditions set in S405. The field of view estimation light source 106-3 starts emitting light according to the drive signal input from the field of view estimation light source drive circuit 101-3.

At this time, the light of the field of view estimation light source 106-3 and the light of the illumination light source 104 that reached the spectroscope 106-2 after being reflected on the surface of the sample 103 in S208 of FIG. 2 reach the surface of the sample 103 after passing through a substantially opposite path after the selector 106-1. Since the light passes through an optically substantially opposite path, a field of view (the light spot) on the sample 103 of the field of view estimation light source 106-3 is substantially equal to the measured field of view on the sample 103 of the spectroscope 106-2. After the light emission of the field of view estimation light source 106-3 is turned on in S406, the processing proceeds to S407 in which a field of view estimation processing is performed. In S407, a processing of estimating a field of view during measurement of the spectral reflection intensity is performed.

Figure 5A:
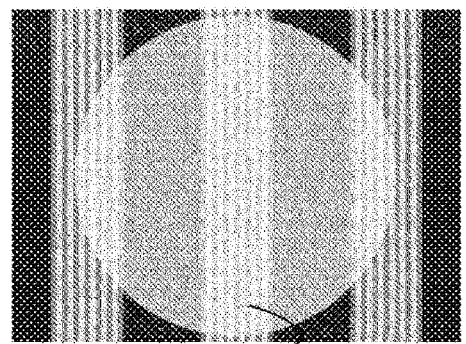
FIG. 5A to FIG. 5G are schematic views showing each image processing in a field of view estimation processing.

The field of view estimation processing in the present embodiment will be described with reference to FIG. 5A to FIG. 5G. For the sample 103 having a mixed pattern of the pattern (1) as the dimension management target and the pattern (2) outside the dimension management target by the three-dimensional shape inspection, FIG. 5A shows a part of a captured image obtained by capturing an image of the sample surface illuminated by the field of view estimation light source 106-3 in S406 by the imaging element 105-9, which is a part of a field of view image detection apparatus. In the field of view estimation processing in S407, the external control device 102, which is a part of the field of view image detection apparatus, first extracts an image of a field of view during measurement of a circular spectral reflection intensity based on the captured image which is captured by the imaging element 105-9. When illuminated by the field of view estimation light source 106-3, the field of view (view of scatterometry) during measurement of the spectral reflection intensity in the captured image has a higher brightness than the other regions.

Therefore, the field of view image detection apparatus extracts a field of view during measurement of circular spectral reflection intensity by an image processing based on a contrast ratio. In the image processing, for example, circular region extraction using Hough transform is performed. An image extracted from a circular region is as shown in a schematic view of FIG. 5B. The image processing used for the circular region extraction is not limited to the Hough transform, and other image processing such as region extraction by machine learning may be used. An estimated field of view during measurement of the spectral reflection intensity in the present embodiment is the extracted circular region. After the circular region extraction in S407, the processing proceeds to S408. In S408, a processing of estimating an area ratio of the pattern (1) as the dimension management target and the pattern (2) outside the dimension management target in the mixed pattern in the field of view estimated in S407 is performed. As described above, the pattern (1) is the first region, which is a region in the field of view of the light spot which can be calculated in advance, and the pattern (2) is the second region, which is a region outside the first region in the field of view of the light spot.

An area ratio estimation processing in the present embodiment will be described with reference to FIG. 5A to FIG. 5G. In S408, first, an image processing for region division of the pattern (1) and the pattern (2) is performed from FIG. 5B, which is an image of the estimated field of view estimated in S407. For example, the area ratio estimation is performed by performing binarization of a region by combining edge detection and morphology conversion.

Figure 5B:
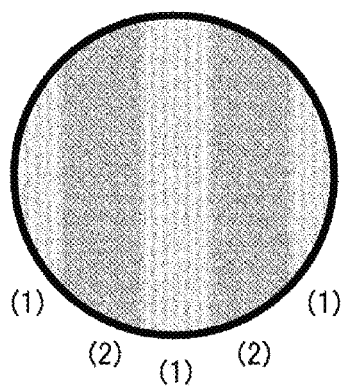
Figure 5C:
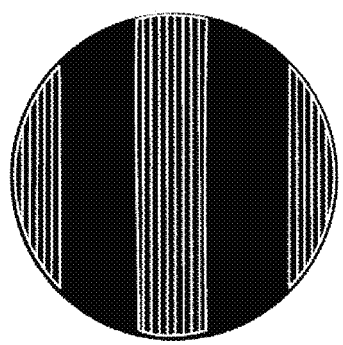
Figure 5D:
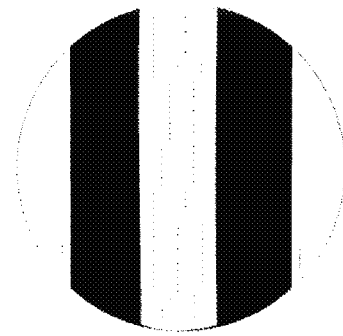
Figure 5E:
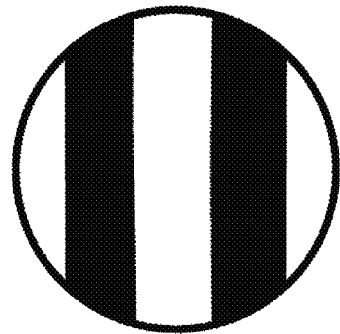
Figure 5F:
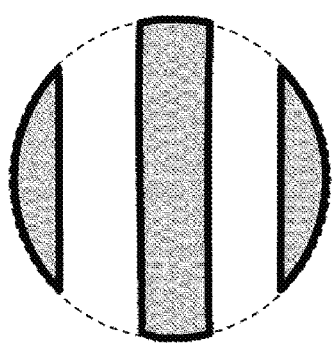
Figure 5G:
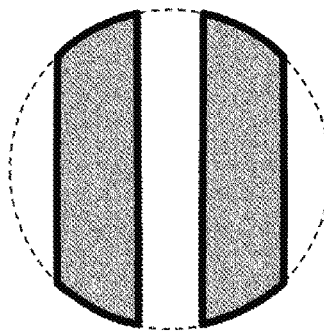

FIG. 5C is a schematic view of a result of performing the edge detection based on discontinuity of luminance with respect to FIG. 5B. FIG. 5D is a schematic view of a result of performing the morphology conversion in which expansion, contraction, or a combination thereof is performed with respect to FIG. 5C. FIG. 5E is a schematic view of a result of performing the region division by binarization with respect to FIG. 5D. FIG. 5F is a schematic view of an image showing a region of only the pattern (1) based on the obtained FIG. 5E, and FIG. 5G is a schematic diagram of an image showing a region of only the pattern (2) based on FIG. 5E. The external control device 102 calculates an area ratio s (0≤s≤1) of the pattern (2) in the entire field of view based on a pixel ratio of FIG. 5F to FIG. 5G, and sets the value as an estimated area ratio in the field of view in the present embodiment. After the area ratio estimation processing in the field of view in S408, the processing proceeds to S409.

In S409, a signal for turning off of the field of view estimation light source 106-3 is input from the external control device 102 to the field of view estimation light source drive circuit 101-3. As a result, the field of view estimation light source drive circuit 101-3 transmits a drive signal to turn off the field of view estimation light source 106-3. When the field of view estimation light source 106-3 is turned off in S409, the measured field of view change and the measured field of view estimation processing in the mixed pattern in the field of view is ended (S410).

With reference to FIG. 6, a method of removing the influence of the pattern outside the dimension management target from the spectral reflection intensity of the mixed pattern when (i) the coherence of the mixed pattern is high (coherent) according to the present embodiment will be described. FIG. 6 is a flowchart of a removal processing on influence of the pattern outside the dimension management target, and a processing subject of this flowchart is the external control device 102. The same applies to the flowcharts of FIGS. 8 and 9 to be described later.

When the removal processing on influence of the pattern outside the dimension management target is started (S601), a sample spectral reflection intensity measurement processing in a predetermined first field of view is performed (S602). The processing performed in S602 is equal to the processing described above with reference to FIG. 2. As a result of S602, acquisitions of a spectral reflection intensity I in the first field of view, and an area ratio s of a pattern outside a dimension management target in the first field of view are completed (S603). When S603 is ended, the processing proceeds to S604. In S604, a sample spectral reflection intensity measurement processing in a predetermined second field of view, which is different from the first field of view, is performed (S604). The processing performed in S604 is the same as S602, and is equal to the processing described above with reference to FIG. 2. As a result of S604, acquisitions of a spectral reflection intensity I' in the second field of view and an area ratio s' of a pattern outside a dimension management target in the second field of view are completed (S605). Here, in the spectral reflection intensity of the measured field of view of the sample 103, at a certain observation point x and time point t, and at a wave number ki whose index in a wavelength range of the spectral reflection intensity measurement corresponds to an i-th wavelength $\lambda i$, an amplitude $\psi 1,i$ of a wave of reflected light in the pattern (1) as the dimension management target and an amplitude $\psi 2,i$ of a wave of reflected light in the pattern (2) outside the dimension management target are generally expressed by Formula 2 using a complex expression. Here, $\varphi$ in Formula 2 represents an initial phase.

[Math 2]

$$\begin{cases} \psi_{1,i}(x, t) = A_1 \exp[j(-k_i x + \omega_1 t + \varphi_1)] \\ \psi_{2,i}(x, t) = A_2 \exp[j(-k_i x + \omega_2 t + \varphi_2)] \end{cases} \quad \text{(Formula 2)}$$

In the present embodiment, since (i) the coherence of the mixed pattern is assumed to be high (coherent), the reflected light of the pattern (1) and the reflected light of the pattern (2) interferes with each other, and a spectral reflection intensity IAll,i of the mixed pattern is obtained by squaring a sum of the amplitudes $\psi$. Further, the spectral reflection intensity IAll,i of the mixed pattern of the present embodiment is expressed by Formula 3 by using the area ratios of the pattern (2), the amplitude $\psi 1,i$ of the pattern (1), and the amplitude $\psi 2,i$ of the pattern (2).

[Math 3]

$$I_{All,i} = |\psi_{All,i}|^2 = |(1-s) \cdot \psi_{1,i}(x,t) + s \cdot \psi_{2,i}(x,t)|^2 \quad \text{(Formula 3)}$$

That is, an amplitude $\psi$All,i of the mixed pattern is expressed by a sum of a product of the amplitude of each pattern forming the mixed pattern and the area ratio thereof and then a square of the sum, so that the intensity is calculated. For simplicity, if $\psi 1,i$ and $\psi 2,i$ are expressed in complex notation as in Formula 4, rather than complex notation using exponentials, the spectral reflection intensity I of the mixed pattern is expressed by Formula 5.

[Math 4]

$$\begin{cases} \psi_{1,i}(x,t) = \alpha_i + j\beta_i \\ \psi_{2,i}(x,t) = \gamma_i + j\delta_i \end{cases} \quad \text{(Formula 4)}$$

[Math 5]

$$I_{All,i} = |\psi_{All,i}|^2 = \{(1-s)\cdot\alpha_i + s\cdot\gamma_i\}^2 + \{(1-s)\cdot\beta_i + s\cdot\delta_i\}^2 \quad \text{(Formula 5)}$$

Here, assuming that the amplitude ψ1,i of the pattern (1) as the dimension management target is obtained in advance by a model calculation such as the RCWA by a pre-spectral feature value calculation function of the external control device 102 based on a cross-sectional structure analysis or the like of an actual measurement unit of the sample 103 whose spectral reflection intensity is to be measured, at a time point up to S603, IAll,i, s, αi, and βi in Formula 5 are known values, and γi and δi which are parameters relating to the pattern (2) are unknown values. However, by obtaining the spectral reflection intensity in the second field of view in S604, as shown in Formula 6, the two unknown values can be reduced to a simultaneous equation of two equations, and the two unknown values, that is, a real part αi and an imaginary part βi of the amplitude ψ2,i of the pattern (2) outside the dimension management target can be derived.

[Math 6]

$$\begin{cases} \underline{I_{All,i}} = |\psi_{All,i}|^2 = \{(\underline{1-s})\cdot\underline{\alpha_i} + \underline{s}\cdot\underline{\gamma_i}\}^2 + \\ \qquad \{(\underline{1-s})\cdot\underline{\beta_i} + \underline{s}\cdot\underline{\delta_i}\}^2 \\ \underline{I'_{All,i}} = |\psi'_{All,i}|^2 = \{(\underline{1-s'})\cdot\underline{\alpha_i} + \underline{s'}\cdot\underline{\gamma_i}\}^2 + \{(\underline{1-s'})\cdot \\ \qquad \underline{\beta_i} + \underline{s'}\cdot\underline{\delta_i}\}^2 \end{cases} \quad \text{(Formula 6)}$$

▬ VALUE OBTAINED BY ACTUAL MEASUREMENT

━ VALUE OBTAINED IN ADVANCE BY MODEL CALCULATION

⁞⁞⁞⁞⁞ UNKNOWN VALUE

In S606, the amplitude ψ2,i of the pattern (2) outside the dimension management target at the wavelength λi is derived by solving the simultaneous equation corresponding to Formula 6. After the real part αi and the imaginary part βi of the amplitude ψ2,i are derived, the processing proceeds to S607. In S607, it is determined whether the index i in the wavelength range of the spectral reflection measurement is equal to an index nend corresponding to a predetermined last wavelength range. In S607, when a current index i is smaller than nend (No in S607), the processing proceeds to S608, and after incrementing the current index i by 1 (S608), the processing proceeds to S606 again.

On the other hand, when it is determined that the current index i is larger than nend (Yes in S607), the processing proceeds to S609. In S609, a spectral reflection intensity IAll,i" of the sample 103 in any desired field of view and an area ratio s" of the pattern (2) in the field of view are measured. The processing performed in S609 is also equal to the processing described above with reference to FIG. 2.

In subsequent S610, by using a real part αcal,i and an imaginary part βcal,i of an amplitude ψ1,cal,i corresponding to an estimation structure model of the pattern (1) as a dimension estimation target and the real part γi and the imaginary part δi of the amplitude ψ2,i of the pattern (2) derived in S606, in any desired field of view of the mixed pattern where the area ratio of the pattern (2) is s", a calculated spectral reflection intensity Ical,i corresponding to the estimation structure model of an i-th index in the wavelength range of the spectral reflection intensity measurement is derived by calculation shown in Formula 7. When the spectral reflection intensity Ical,i is derived, the processing proceeds to S611.

[Math 7]

$$I_{cal,i} = \{(1-s'')\cdot\alpha_{cal,i} + s''\cdot\gamma_i\}^2 + \{(1-s'')\cdot\beta_{cal,i} + s''\cdot\delta_i\}^2 \quad \text{(Formula 7)}$$

In S611, it is determined whether the index i in the wavelength range of the spectral reflection intensity measurement is equal to the index nend corresponding to the predetermined last wavelength range. In S611, when a current index i is smaller than nend (No in S611), the processing proceeds to S612, and after incrementing the current index i by 1 (S612), the processing proceeds to S610 again. On the other hand, when it is determined that the current index i is larger than nend (Yes in S611), the processing proceeds to S613.

In S613, after comparing the calculated intensity Ical,i corresponding to the estimation structure model with the sample spectral reflection intensity IAll,i" in an actual measured field of view, it is determined whether the calculated intensity Ical,i matches the sample spectral reflection intensity IAll,i" at all wavelengths. As a determination, for example, in all wavelength range, a square sum of a difference between the calculated intensity Ical,i corresponding to the estimation structure model obtained by the calculation and the sample spectral reflection intensity IAll,i" in the actual measured field of view is calculated, and a determination is made based on whether this value is within a predetermined threshold value. In S613, when it is determined that the calculated intensity Ical,i corresponding to the estimation structure model at all wavelengths is not equal to the sample spectral reflection intensity IAll, i" in any desired field of view (No in S613), the processing proceeds to S614, and after a current structural parameter of the pattern (1) as the dimension estimation target is changed (S614), the processing proceeds to S610 again.

On the other hand, in S613, when it is determined that the calculated intensity Ical,i corresponding to the estimation structure model at all wavelengths is equal to the sample spectral reflection intensity IAll,i" in any desired field of view (Yes in S613), the removal processing on influence of pattern outside the dimension management target when (i) the coherence of the mixed pattern is high is ended (S615). In FIG. 6, the calculated intensity Ical,i corresponding to the estimation structure model at all wavelengths and the sample spectral reflection intensity IAll, i" in any desired field of view are denoted by Ical and IAll".

Here, as is clear from Formula 6, when (i) the coherence of the mixed pattern is high, since there are two unknown values to be derived, the simultaneous equations based on two or more equations can be constructed, and the simultaneous equations are constructed by performing two measurements in which the measured field of view is changed as an example in FIG. 6 described above. The method of constructing the simultaneous equations is not limited to performing the measurement in which the measured field of view is changed, and the simultaneous equations may be constructed by the spectral reflection intensity before and after the structure in the field of view changes even in the same field of view.

Figure 7A:
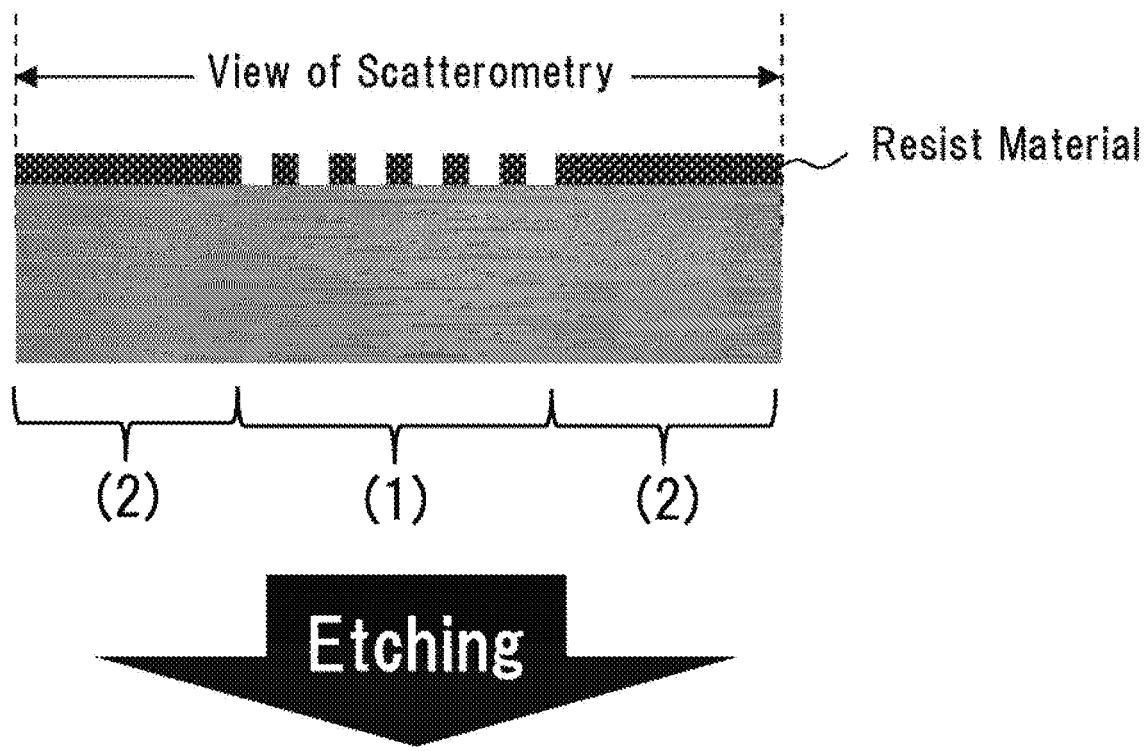
FIG. 7A and FIG. 7B are schematic views showing a sample 103 before and after plasma etching as viewed from a cross-sectional direction.

For example, FIG. 7A is a schematic view of a field of view (view of scatterometry) during measurement of scattered light of the sample 103 viewed from a cross-sectional direction. An upper portion of a cross section represents a resist material intended for pattern protection during plasma etching. A region in which an entire surface is covered with the resist material is the pattern (2) outside the dimension management target, and a region in which only a part is covered with the resist material is the pattern (1) as the dimension management target.

Figure 7B:
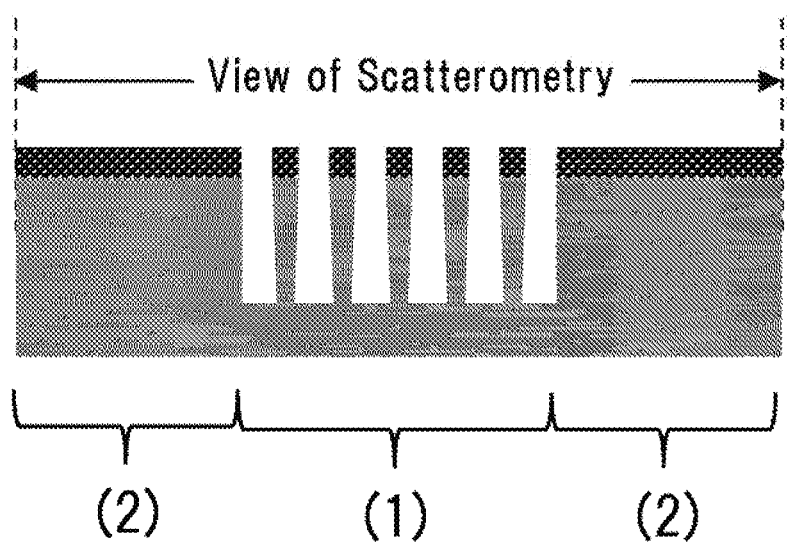

On the other hand, FIG. 7B is a schematic view of the sample 103 after the plasma etching of FIG. 7A viewed from the same cross-sectional direction. The pattern (1) is etched, and a three-dimensional structure thereof is changed. When the amplitude of the pattern (1) as the dimension management target in FIGS. 7A and 7B is obtained by a model calculation such as the RCWA by the pre-spectral feature value calculation function of the external control device 102 based on the cross-sectional structure analysis or the like of the actual measurement unit of the sample 103 whose spectral reflection intensity is to be measured, by measuring the spectral reflection intensity in FIGS. 7A and 7B, the simultaneous equations can be constructed to obtain the amplitudes $\Psi 2,i$ of the pattern (2) outside the dimension management target.

According to the above configuration and operation shown in the present embodiment, the three-dimensional shape detection apparatus 100 can remove the influence of the pattern outside the dimension management target without modeling when (i) the coherence of the mixed pattern is high (coherent), and thus the dimension (three-dimensional shape) management of any desired field of view can be made.

Second Embodiment

In the present embodiment, a method of removing an influence of a pattern outside the dimension management target without modeling when (ii) the coherence of the mixed pattern is low (incoherent) will be described below.

Also in the second embodiment, the same contents as the processing contents described in the first embodiment are performed for the sample spectral reflection intensity measurement processing. Hereinafter, with reference to FIG. 8, according to the present embodiment, the method of removing the influence of the pattern outside the dimension management target from the spectral reflection intensity of the mixed pattern when (ii) the coherence of the mixed pattern is low (incoherent) which is different from the first embodiment will be described.

FIG. 8 is a flowchart of the removal processing on influence of a pattern outside the dimension management target. When the removal processing on the influence of the pattern outside the dimension management target is started (S801), a sample spectral reflection intensity measurement processing in a predetermined field of view is performed (S802). The processing performed in S802 is equal to the processing described above with reference to FIG. 2 in the first embodiment. As a result of S802, acquisitions of a spectral reflection intensity I in the predetermined field of view and an area ratio s of the pattern outside the dimension management target in the predetermined field of view are completed (S803). Here, in the spectral reflection intensity measurement of the sample 103, in the present embodiment, a spectral reflection intensity IAll,i of the mixed pattern at the i-th wavelength $\lambda i$ in a measurement range of the spectral reflection intensity measurement is expressed by Formula 8.

[Math 8]

$$I_{All,i} = (1-s) \cdot I_{1,i} + s \cdot I_{2,i} \quad \text{(Formula 8)}$$

<u>VALUE OBTAINED BY ACTUAL MEASUREMENT</u>

VALUE OBTAINED IN ADVANCE BY MODEL CALCULATION

UNKNOWN VALUE

That is, the intensity IAll,i of the mixed pattern is expressed by a sum of a product of the intensity of each pattern forming the mixed pattern and the area ratio thereof. This is because, in the present embodiment, since (i) the coherence of the mixed pattern is assumed to be low (incoherent), the spectral reflection intensity IAll,i is expressed by the sum of the intensities instead of taking the sum of the amplitudes of the reflected light of the pattern (1) and the reflected light of the pattern (2) and squaring the sum as in the first embodiment. Here, assuming that the spectral reflection intensity I1,i of the pattern (1) as the dimension management target is obtained in advance by a model calculation such as the RCWA by the pre-spectral feature value calculation function of the external control device 102 based on the cross-sectional structure analysis or the like of the actual measurement unit of the sample 103 whose spectral reflection intensity is to be measured, at a time point up to S803, IAll,i, s, and I1,i in Formula 8 are known values, and only the spectral reflection intensity I2,i of the pattern (2) is an unknown value. Therefore, by solving the equation for one unknown value shown in Formula 8, it is possible to derive the unknown value, that is, the spectral reflection intensity I2,i of the pattern (2) (S804). After the spectral reflection intensity I2,i of the pattern (2) outside the dimension management target at the wavelength $\lambda i$ is derived, the processing proceeds to S805.

In S805, it is determined whether the index i in the wavelength range of the spectral reflection intensity measurement is equal to the index nend corresponding to the predetermined last wavelength range. In S805, when a current index i is smaller than nend (No in S805), the processing proceeds to S806, and after incrementing the current index i by 1 (S806), the processing proceeds to S804 again. On the other hand, when it is determined that the current index i is larger than nend (Yes in S805), the processing proceeds to S807.

In S807, the spectral reflection intensity IAll,i" of the sample 103 in any desired field of view and the area ratio s" of the pattern (2) in the field of view are measured. The processing performed in S807 is also equal to the processing described above with reference to FIG. 2. In subsequent S808, using the spectral reflection intensity I1,cal,i corresponding to an estimation structure model of the pattern (1) as the dimension estimation target and the spectral reflection intensity I2,i of the derived pattern (2), in any desired field of view of the mixed pattern where the area ratio of the pattern (2) is s", a calculated spectral reflection intensity Ical,i corresponding to the estimation structure model of an i-th index in the wavelength range of the spectral reflection intensity measurement is derived by calculation shown in Formula 9.

[Math 9]

$$I_{cal,i} = (1-s'') \cdot I_{1,cal,i} + s'' \cdot I_{2,i} \quad \text{(Formula 9)}$$

When the spectral reflection intensity Ical,i is derived, the processing proceeds to S809. In S809, it is determined whether the index i in the wavelength range of the spectral reflection intensity measurement is equal to the index nend corresponding to the predetermined last wavelength range. In S809, when a current index i is smaller than nend (No in S809), the processing proceeds to S810, and after incrementing the current index i by 1 (S810), the processing proceeds to S808 again. On the other hand, when it is determined that the current index i is larger than nend (Yes in S809), the processing proceeds to S811.

In S811, after comparing the calculated intensity Ical,i corresponding to the estimation structure model with the sample spectral reflection intensity IAll,i" in an actual measured field of view, it is determined whether the calculated intensity Ical,i matches the sample spectral reflection intensity IAll,i" at all wavelengths. As a determination, for example, in all wavelength range, a square sum of a difference between the calculated intensity Ical,i corresponding to the estimation structure model obtained by the calculation and the sample spectral reflection intensity IAll,i" in the actual measured field of view is calculated, and a determination is made based on whether this value is within a predetermined threshold value. In S811, when it is determined that the calculated intensity Ical,i corresponding to the estimation structure model at all wavelengths is not equal to the sample spectral reflection intensity IAll,i" in any desired field of view (No in S811), the processing proceeds to S812, and after a current structural parameter of the pattern (1) as the dimension estimation target is changed (S812), the processing proceeds to S808 again.

On the other hand, in S811, when it is determined that the calculated intensity Ical,i corresponding to the estimation structure model at all wavelengths is equal to the sample spectral reflection intensity IAll,i" in any desired field of view (Yes in S811), the removal processing on influence of the pattern outside the dimension management target when (ii) the coherence of the mixed pattern is low (incoherent) is ended (S813). In FIG. 8, the calculated intensity Ical,i corresponding to the estimation structure model at all wavelengths and the sample spectral reflection intensity IAll,i" in any desired field of view are denoted by Ical and IAll".

According to the above configuration and operation shown in the present embodiment, the three-dimensional shape detection apparatus 100 can remove the influence of the pattern outside the dimension management target without modeling when (ii) the coherence of the mixed pattern is low (incoherent), and thus the dimension (three-dimensional shape) management of any desired field of view can be made.

Third Embodiment

In the present embodiment, a method of removing an influence of a pattern outside the dimension management target without modeling when (iii) the coherence of the mixed pattern is between (i) and (ii) will be described below.

Also in the present embodiment, the same contents as the processing contents described in the first embodiment are performed for the sample spectral reflection intensity measurement processing. Hereinafter, with reference to FIG. 9, according to the present embodiment, the method of removing the influence of the pattern outside the dimension management target from the spectral reflection intensity of the mixed pattern when (iii) the coherence of the mixed pattern is between (i) and (ii) which is different from the first and second embodiments will be described.

FIG. 9 is a flowchart of the removal processing on influence of a pattern outside the dimension management target. When the removal processing on the influence of the pattern outside the dimension management target is started (S901), a sample spectral reflection intensity measurement processing in a predetermined first field of view is performed (S902). The same contents as the processing contents described in the first embodiment are performed for the processing performed in S902. As a result of S902, acquisitions of a spectral reflection intensity I in the first field of view and an area ratio s of a pattern outside a dimension management target in the first field of view are completed (S903). When S903 is ended, the processing proceeds to S904. In S904, a sample spectral reflection intensity measurement processing in a predetermined second field of view, which is different from the first field of view, is performed (S904). The processing performed in S904 is the same as S902, and is equal to the processing described above with reference to FIG. 2. As a result of S904, acquisitions of a spectral reflection intensity I' in the second field of view and an area ratio s' of the pattern outside the dimension management target in the second field of view are completed (S905).

Here, in the present embodiment, since (iii) the coherence of the mixed pattern is assumed to be between (i) and (ii), a part of the spectral reflection intensity IAll,i of the mixed pattern interferes with the reflected light of the pattern (1) and the reflected light of the pattern (2), and a part does not interfere with the reflected light of the pattern (1) and the reflected light of the pattern (2), and therefore, the spectral reflection intensity IAll,i of the mixed pattern is expressed by a first equation of Formula 10.

[Math 10]

$$\begin{aligned}I_{All,i} &= f_c\{(1-s) \cdot I_{1,i} + s \cdot I_{2,i}\} + (1-f_c) \\ &\quad \{(1-s) \cdot \alpha_1 + s \cdot \gamma_i\}^2 + \{(1-s) \cdot \beta_i + s \cdot \delta_i\}^2 \\ &= f_c\left\{(1-s) \cdot I_{1,i} + \frac{s}{2}(\gamma_i^2 + \delta_i^2)\right\} + (1-f_c) \\ &\quad \{(1-s) \cdot \alpha_1 + s \cdot \gamma_i\}^2 + \{(1-s) \cdot \beta_i + s \cdot \delta_i\}^2\end{aligned} \quad \text{(Formula 10)}$$

A term with low coherence, which is a product of the coherence factor fc, is expressed as a sum of a product of the intensity of each pattern forming the mixed pattern and the area ratio thereof, and a term with high coherence, which is a product of a remaining 1−fc, is expressed as a sum of a product of the amplitude of each pattern forming the mixed pattern and the area ratio thereof. Since the spectral reflection intensity I2,i of the pattern (2) is equal to half a square of an absolute value of the amplitude, the intensity is expressed by a second equation of Formula 10. Here, assuming that the spectral reflection intensity I1,i and a real part αi and an imaginary part βi of the amplitude of the pattern (1) as the dimension management target are obtained in advance by a model calculation such as the RCWA by the pre-spectral feature value calculation function of the external control device 102 based on the cross-sectional structure analysis or the like of the actual measurement unit of the sample 103 whose spectral reflection intensity is to be measured, at a time point up to S903, IAll,i, I1,I, s, αi, and βi in Formula 10 are known values, and γi and δi which are parameters relating to the pattern (2) are unknown values. However, by obtaining the spectral reflection intensity in the second field of view in S904, as shown in Formula 11, the two unknown values can be reduced to a simultaneous equation of two equations, and the two unknown values, that is, a real part αi and an imaginary part βi of the amplitude ψ2,i of the pattern (2) outside the dimension management target can be derived.

[Math 11]

$$\begin{cases} \underline{I_{all,i}} = \underline{f_c}\{(1-s) \cdot I_{1,i} + \frac{s}{2}(\gamma_i^2 + \delta_i^2)^2\} + \\ (1-\underline{f_c})\{(\underline{1-s}) \cdot \underline{\alpha_i} + \underline{s} \cdot \gamma_i)^2 + \{(\underline{1-s}) \cdot \underline{\beta_i} + \underline{s} \cdot \delta_i\}^2 \\ \underline{I_{all,i'}} = \underline{f_c}\{(1-s') \cdot I_{1,i} + \frac{s'}{2}(\gamma_i^2 + \delta_i^2)^2\} + \\ (1-\underline{f_c})\{(\underline{1-s'}) \cdot \underline{\alpha_i} + \underline{s'} \cdot \gamma_i)^2 + \{(\underline{1-s'}) \cdot \underline{\beta_i} + \underline{s'} \cdot \delta_i\}^2 \end{cases}$$ (Formula 11)

▬▬ VALUE OBTAINED BY ACTUAL MEASUREMENT

▬ VALUE OBTAINED IN ADVANCE BY MODEL CALCULATION

⁓⁓⁓ UNKNOWN VALUE

In S906, the real part αi and the imaginary part βi of the amplitude ψ2,i of the pattern (2) outside the dimension management target at the wavelength λi is derived by solving the simultaneous equation corresponding to Formula 11. After the amplitude ψ2,i is derived, the processing proceeds to S907. In S907, it is determined whether the index i in the wavelength range of the spectral reflection measurement is equal to an index nend corresponding to a predetermined last wavelength range. In S907, when a current index i is smaller than nend (No in S907), the processing proceeds to S908, and after incrementing the current index i by 1 (S908), the processing proceeds to S906 again. On the other hand, when it is determined that the current index i is larger than nend (Yes in S907), the processing proceeds to S909. In S909, the spectral reflection intensity IAll,i" of the sample 103 in any desired field of view and the area ratio s" of the pattern (2) in the field of view are measured. The processing performed in S909 is also equal to the processing described above with reference to FIG. 2.

In subsequent S910, using the spectral reflection intensity I1,cal,i corresponding to the estimation structure model and a real part αcal,i and an imaginary part βcal,i of an amplitude ψ1,cal,i of the pattern (1) as the dimension estimation target, and the real part γi and the imaginary part δi of the amplitude ψ2,i of the pattern (2) derived in S906, in any desired field of view of the mixed pattern where the area ratio of the pattern (2) is s", a calculated spectral reflection intensity Ical,i corresponding to the estimation structure model of an i-th index in the wavelength range of the spectral reflection intensity measurement is derived by calculation shown in Formula 12.

[Math 12]

$$I_{cal,i} = f_c\{(1-s'') \cdot I_{1,cal,i} + \frac{s''}{2}(\gamma_i^2 + \delta_i^2)^2\} + \\ (1-f_c)\{(1-s'') \cdot \alpha_{cal,i} + s'' \cdot \gamma_i)^2 + \\ \{(1-s'') \cdot \beta_{cal,i} + s'' \cdot \delta_i\}^2$$ (Formula 12)

When the spectral reflection intensity Ical,i is derived, the processing proceeds to S911. In S911, it is determined whether the index i in the wavelength range of the spectral reflection intensity measurement is equal to the index nend corresponding to the predetermined last wavelength range. In S911, when a current index i is smaller than nend (No in S911), the processing proceeds to S912, and after incrementing the current index i by 1 (S912), the processing proceeds to S910 again. On the other hand, when it is determined that the current index i is larger than nend (Yes in S911), the processing proceeds to S913. In S913, after comparing the calculated intensity Ical,i corresponding to the estimation structure model with the sample spectral reflection intensity IAll,i" in an actual measured field of view, it is determined whether the calculated intensity Ical,i matches the sample spectral reflection intensity IAll,i" at all wavelengths. As a determination, for example, in all wavelength range, a square sum of a difference between the calculated intensity Ical,i corresponding to the estimation structure model obtained by the calculation and the sample spectral reflection intensity IAll,i" in the actual measured field of view is calculated, and a determination is made based on whether this value is within a predetermined threshold value. In S913, when it is determined that the calculated intensity Ical,i corresponding to the estimation structure model at all wavelengths is not equal to the sample spectral reflection intensity IAll,i" in any desired field of view (No in S913), the processing proceeds to S914, and after a current structural parameter of the pattern (1) as the dimension estimation target is changed (S914), the processing proceeds to S910 again. On the other hand, in S913, when it is determined that the calculated intensity Ical,i corresponding to the estimation structure model at all wavelengths is equal to the sample spectral reflection intensity IAll,i" in any desired field of view (Yes in S913), the removal processing on influence of the pattern outside the dimension management target when (iii) the coherence of the mixed pattern is between (i) and (ii) is ended (S915). In FIG. 9, the calculated intensity Ical,i corresponding to the estimation structure model at all wavelengths and the sample spectral reflection intensity IAll,i" in any desired field of view are denoted by Ical and IAll".

In the above example, the influence of the pattern (2) whose amplitude is outside the dimension management target is removed by estimating the amplitude ψ2,i, but the spectral reflection intensity I2,i and the amplitude ψ2,i of the pattern (2) may be estimated and derived based on the measurement of the spectral reflection intensity in at least three or more fields of view.

According to the above configuration and operation shown in the present embodiment, the three-dimensional shape detection apparatus 100 can remove the influence of the pattern outside the dimension management target without modeling when (iii) the coherence of the mixed pattern is between (i) and (ii), and thus the dimension (three-dimensional shape) management of any desired field of view can be made.

The invention is not limited to the above-described embodiments and includes various modifications. For example, the embodiments described above have been described in detail for better understanding of the invention, and are not necessarily limited to the embodiments that include all the configurations described above.

Further, although the above-described configurations, functions, external control devices, and the like have been mainly described as an example of creating a program for a CPU that implements some or all of the functions, it is needless to say that some or all of them may be implemented by hardware, for example, by designing an integrated circuit. That is, all or apart of the functions of the external control device may be implemented by the integrated circuit such as an application specific integrated circuit (ASIC) or a field programmable gate array (FPGA) instead of the program.

REFERENCE SIGN LIST

100: three-dimensional shape detection apparatus
101: controller group
101-0: selector control circuit
101-1: illumination light source drive circuit
101-2: spectroscope control circuit
101-3: field of view estimation light source drive circuit
101-4: light receiving element control circuit
101-5: polarizer drive circuit
101-6: moving stage drive circuit
102: external control device
103: sample
104: illumination light source
105: optical system
105-1: connector A
105-2: lens group A
105-3: mirror
105-4: non-polarizing beam splitter A
105-5: lens group B
105-6: non-polarizing beam splitter B
105-7: polarizer
105-8: lens group C
105-9: imaging element
105-10: lens group D
105-11: connector B
106: spectroscope group
106-1: selector
106-2: spectroscope
106-3: field of view estimation light source
107: optical system moving mechanism
108: sample transport mechanism

The invention claimed is:

1. A three-dimensional shape detection apparatus that detects a three-dimensional shape in a field of view of a light spot with which a target is irradiated, the three-dimensional shape detection apparatus comprising:
a spectroscope responsive to a control circuit configured to measure a spectral reflection intensity using the spectroscope;
an external controller configured to calculate and obtain a spectral feature value of a first region, which is a region in the field of view of the light spot, based on the spectral reflection intensity measured by the spectroscope;
a field of view estimation light source and drive circuit configured to, under control of the external controller, capture an image of the target illuminated by an emitted light and estimate an area ratio between an area of the first region and an area of a second region based on the captured image; and
a control device configured to obtain the three-dimensional shape based on the estimated area ratio, wherein the second region is a region outside the first region in the field of view of the light spot.

2. The three-dimensional shape detection apparatus according to claim 1, wherein
the spectral feature value is a complex amplitude, the spectral reflection intensity, or the complex amplitude and the spectral reflection intensity.

3. The three-dimensional shape detection apparatus according to claim 1, wherein
the spectral feature value is the complex amplitude, and the external controller is further configured to calculate a complex amplitude of the second region based on a complex amplitude of the first region calculated in advance, a plurality of spectral reflection intensities measured by the spectroscope, and the area ratio.

4. The three-dimensional shape detection apparatus according to claim 3, further comprising:
a plasma processing apparatus configured to change a structure of the first region, wherein
the plurality of spectral reflection intensities are a plurality of spectral reflection intensities in the structure of the first region changed by the plasma processing apparatus.

5. The three-dimensional shape detection apparatus according to claim 4, wherein
the plasma processing apparatus is a plasma etching apparatus.

6. The three-dimensional shape detection apparatus according to claim 1, wherein
the spectral feature value is the complex amplitude and the spectral reflection intensity, and
the external controller is further configured to obtain a complex amplitude of the second region and a spectral reflection intensity of the second region based on a complex amplitude of the first region calculated in advance, a spectral reflection intensity of the first region calculated in advance, a plurality of spectral reflection intensities measured by the spectroscope, and the area ratio.

7. The three-dimensional shape detection apparatus according to claim 6, further comprising:
a plasma processing apparatus configured to change a structure of the first region, wherein
the plurality of spectral reflection intensities are a plurality of spectral reflection intensities in the structure of the first region changed by the plasma processing apparatus.

8. The three-dimensional shape detection apparatus according to claim 1, wherein
the spectral feature value is the spectral reflection intensity, and
the external controller is further configured to obtain a spectral reflection intensity of the second region based on a spectral reflection intensity of the first region calculated in advance, a spectral reflection intensity measured by the spectroscope, and the area ratio.

9. An area ratio estimation method for estimating an area ratio which is used in detecting a three-dimensional shape in a field of view of a light spot with which a target is irradiated, the area ratio estimation method comprising:
capturing an image of the target illuminated by an emitted light and estimating the area ratio based on the captured image, wherein
the area ratio is an area ratio between an area of a first region and an area of a second region, the first region is a region in the field of view of the light spot, and the second region is a region outside the first region in the field of view of the light spot.

10. A three-dimensional shape detection method for detecting a three-dimensional shape in a field of view of a light spot with which a target is irradiated, the three-dimensional shape detection method comprising:
- a step of measuring a spectral reflection intensity;
- a step of obtaining a spectral feature value of a first region in the field of view of the light spot based on the measured spectral reflection intensity;
- a step of capturing an image of the target illuminated by an emitted light and estimating an area ratio between an area of the first region and an area of a second region based on the captured image; and
- a step of obtaining the three-dimensional shape based on the estimated area ratio, wherein
- the second region is a region outside the first region in the field of view of the light spot.

11. The three-dimensional shape detection method according to claim 10, wherein
- the spectral feature value is a complex amplitude, and
- in the step of obtaining the spectral feature value, a complex amplitude of the second region is obtained based on a complex amplitude of the first region calculated in advance, a plurality of measured spectral reflection intensities, and the area ratio.

12. The three-dimensional shape detection method according to claim 10, wherein
- the spectral feature value is the complex amplitude and the spectral reflection intensity, and
- in the step of obtaining the spectral feature value, a complex amplitude of the second region and a spectral reflection intensity of the second region are obtained based on a complex amplitude of the first region calculated in advance, a spectral reflection intensity of the first region calculated in advance, a plurality of measured spectral reflection intensities, and the area ratio.

13. The three-dimensional shape detection method according to claim 10, wherein
- the spectral feature value is the spectral reflection intensity, and
- in the step of obtaining the spectral feature value, a spectral reflection intensity of the second region is obtained based on a spectral reflection intensity of the first region calculated in advance, a measured spectral reflection intensity, and the area ratio.

14. A plasma processing apparatus comprising:
- a processing chamber in which a sample is subjected to plasma processing;
- a radio frequency power supply configured to supply radio frequency power for generating plasma;
- a sample stage on which the sample is placed; and
- a three-dimensional shape detection apparatus configured to detect a three-dimensional shape in a field of view of a light spot with which the sample is irradiated, wherein
the three-dimensional shape detection apparatus includes:
- a spectroscope responsive to a control circuit configured to measure a spectral reflection intensity using the spectroscope;
- an external controller configured to calculate and obtain a spectral feature value of a first region, which is a region in the field of view of the light spot, based on the spectral reflection intensity measured by the spectroscope;
- a field of view estimation light source and drive circuit configured to, under control of the external controller, capture an image of the target illuminated by an emitted light and estimate an area ratio between an area of the first region and an area of a second region based on the captured image; and
- a control device configured to obtain the three-dimensional shape based on the estimated area ratio, in which
the second region is a region outside the first region in the field of view of the light spot.

* * * * *